United States Patent [19]

Landt et al.

[11] 4,456,895
[45] Jun. 26, 1984

[54] BAND SELECTABLE TUNABLE BANDPASS FILTER

[75] Inventors: Harvey L. Landt; Glenn R. Snider, both of Cedar Rapids, Iowa

[73] Assignee: Rockwell International Corporation, El Segundo, Calif.

[21] Appl. No.: 381,809

[22] Filed: May 25, 1982

[51] Int. Cl.³ .......................... H03H 7/09; H01P 1/208
[52] U.S. Cl. ..................................... 333/174; 333/177; 333/185; 333/202
[58] Field of Search ..................... 333/202, 174–177, 333/167, 17 R, 17 L; 334/15

[56] References Cited

U.S. PATENT DOCUMENTS

| | | | |
|---|---|---|---|
| 2,872,649 | 2/1959 | Boothe | 333/185 X |
| 3,903,487 | 9/1975 | Maier | 333/177 |
| 3,959,746 | 5/1976 | Straw | 333/17 M |
| 4,153,887 | 5/1979 | Poppa | 333/175 |
| 4,365,221 | 12/1982 | Vizmuller | 333/202 |

Primary Examiner—Marvin L. Nussbaum
Attorney, Agent, or Firm—Richard K. Robinson; George A. Montanye; H. Fredrick Hamann

[57] ABSTRACT

A two resonator bandpass filter that is tunable is disclosed with each resonator consisting of three series connected inductors and a tuning capacitors. The inductors comprising each resonator are contained in a common enclosure isolated from each other by a ground shield having a fixed aperture opening for electromagnetic coupling between the two resonators. Shorting plugs are used as the bandswitching techniques for switching the bands of the resonators. Variable capacitors in each of the resonator's circuit provide for tuning of each band to a desired frequency.

2 Claims, 4 Drawing Figures

BAND SELECTABLE TUNABLE BANDPASS FILTER

BACKGROUND OF THE INVENTION

This invention relates to bandpass filters and in particular to bandpass filters having variable bands of operation.

The prior art high frequency (HF) filtering designs required complex switching and aperture designs to cover broad operating frequency ranges. The prior art bandpass filters used in the HF band were designed to cover limited frequency ranges such as 3 to 1 or 4 to 1. Thus to cover a broad range of frequencies such as from 1.6 to 30 MHz required three filter designs. Other arrangements employ complex bandswitching schemes to selectively connect the coil comprising the resonators in series or in parallel. This prior art approach is limited to two bands and is also very costly; and the resulting filter usually provides non-optimal performance.

SUMMARY OF THE INVENTION

A two resonator bandpass filter that is tunable is disclosed with each resonator consisting of three series connected inductors and a tuning capacitor. The inductors comprising each resonator are contained in a common enclosure and isolated from each other by a ground shield having a fixed aperture opening for electromagnetic coupling between the two resonators. Shorting plugs are used as the bandswitching technique for switching the bands of the resonators. Variable capacitors in each circuit of the resonator provide tuning of each band to a desired frequency.

It is the objective of this invention to provide a tunable bandpass filter that utilizes a bandswitching technique that does not adversely affect the operating Q (quality of merit) of the filter over all frequencies in each band.

It is another objective of the invention to provide a tunable bandpass filter that has a high unloaded Q while being contained in a smaller volume than other prior art filters.

BRIEF DESCRIPTION OF THE DRAWINGS

In order that the invention may be readily carried into practice, a number of embodiments will now be described in detail by way of example, with reference to the accompanying drawings in which.

DETAILED DESCRIPTION OF THE PREFERRED EMBODIMENT

Figure 1:
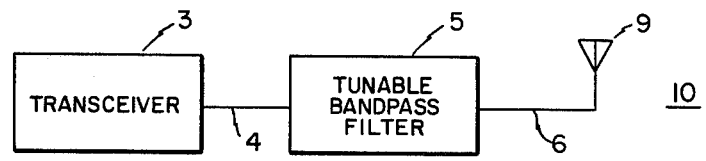
FIG. 1 is a block diagram of a circuit utilizing a band selectable tunable bandpass filter according to the invention.

In FIG. 1 to which reference should now be made there is shown a radio transmission system 10 that includes a transceiver 3 that drives a load represented by an antenna 9. The transceiver 3 either provides radio frequency information to the load or antenna 9 for propagation or receives electromagnetic information from the antenna 9. Located between the transceiver 3 and the antenna 9 is a tunable bandpass filter 5 that must operate over the entire range of frequencies on which the transceiver 3 processes information. Modern radio transceivers often transmit over a very broad range of frequencies such as 1.6 MHz to 30 MHz range. The traditional way of adjusting filtering circuits through the tuning of variable capacitors is limited in these applications due to the limitations of the size of the variable capacitor.

Figure 2:
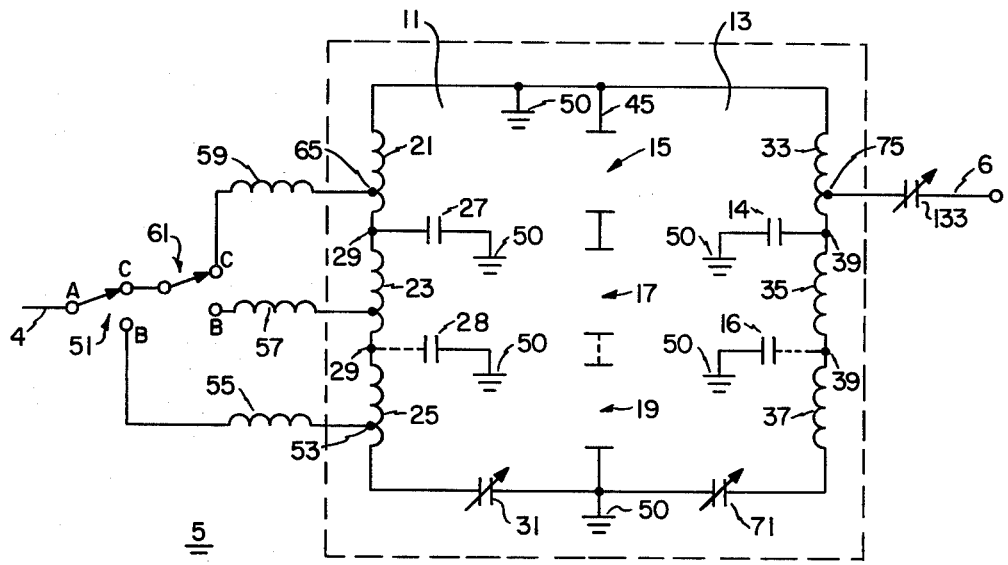
FIG. 2 is a schematic diagram of the band selectable tunable bandpass filter according to the invention.

A band switchable filter is shown in FIG. 2 to which reference should now be made. The band switchable filter consists of two resonators, resonator 11 and resonator 13, which are cavity resonators that are magnetically coupled through the apertures 15, 17 and 19. The first resonator 11 consists of a series connection of N resonator coils, the first coil 21, the second coil 23 and the Nth coil 25. At the connection between each set of neighboring coils there are contacts 27 and 28 which will short the node points 29 between two neighboring coils to ground. A tuning capacitor 31 is in series with the series connected coil and is used to provide tuning over a band of frequencies that are selected by the closing of contacts 27 and 28. The second resonator 13 consists of a series of N serially connected coils including the first coil 33, the second coil 35 and the Nth coil 37. Each coil is joined together at node points 39. Connected to each node point 39 are contacts 14 and 16 which, upon closing, will short the node points 39 to the reference potential or ground 50. There is a ground plane 45 that separates the first cavity resonator 11 from the second cavity resonator 13. The aperture openings 15, 17 and 19 are selected to ensure the optimal magnetic coupling between each coil member of the first resonator cavity 11 to its corresponding member in the second resonator cavity 13. As shown in FIG. 2, end terminals of each of the serially connected inductors and tuning capacitor are coupled to the reference potential or ground 50.

Equation 1 of Table 1 provides the equation for selection of the first aperture opening 15, the second aperture opening 17, and the Nth aperture opening 19. In the situation where N is equal to 3, the signal that is provided from a signal source such as the transceiver 3 is applied via conductor 4 to a switch 51 for application to the tunable bandpass filter 5. Conductor 6, as indicated in FIG. 1, connects the output of the tunable bandpass filter 5 to the load that is represented by the antenna 9. When switch 51 is connected such that terminal A is connected to terminal 8, then the signal would be applied to the Nth or, when N is equal to 3, the third inductor 25 at tapped point 53 via a choke 55. The tapped inductor acts as an auto transformer and couples through the transformer action of the circuit the applied signal to the first inductor 21 and the second inductor 23. Magnetic coupling between the first cavity resonator 11 and the second cavity resonator 13 will cause this signal to be picked up by the first inductor 33, the second inductor 35 and the third inductor 37. In the event contacts 28 and 16 are closed, then the second band of the circuit is provided and the signal from the transceiver 3 is applied via conductor 4 to terminal A of the switch 51. Terminal A is connected to terminal C which is also part of the switch 61. For the second band, terminal A of switch 61 is connected to terminal B. The signal again is applied to a tapped winding by an inductor 57. The third band is provided when contacts 27 and 14 are shorted in addition to contacts 28 and 16 and switch 51 is connected by terminal A to terminal C and switch 61 is connected to terminal C from terminal A then the signal is applied to the first inductor 21 at its tapped point 65 via the choked inductor 59. The inductances of the chokes are selected to ensure that, over the band of frequencies that the tunable bandpass filter 5 is to operate on, the desired circuit Q under loaded conditions can be achieved.

In each band the variable capacitor 31 is tunable so that any frequency within that band may be selected. Similarly, capacitor 71 may be varied to ensure maximum magnetic coupling between the first cavity resonator 11 and the second cavity resonator 13 at the desired frequency. Capacitor 133 is connected to a tapped terminal 75 of the first inductor 33 that is located within the second cavity resonator 13. Capacitor 133 is for impedance matching of the tunable bandpass filter 5 to the load which in the case of FIG. 1 would be the antenna 9.

The switching of the coils to ensure the highest possible Q of the resonating tank is achieved by using shorting plugs that connect the node points to ground. This feature is readily apparent from FIG. 3 to which reference should now be made and is a partial sectional view of a tunable bandpass filter according to the invention.

Figure 3:
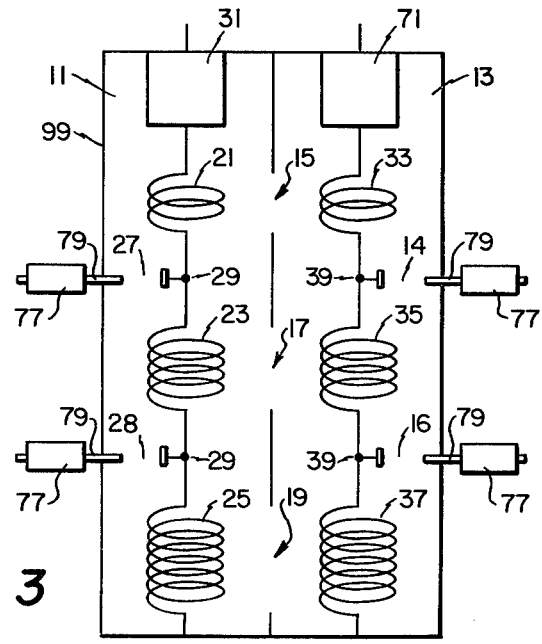
FIG. 3 is a partial sectional view of the band selectable tunable bandpass filter according to the invention.

FIG. 3 illustrates the shorting of the node point 29 in the case of the first cavity resonator 11 and node points 39 in the case of the second cavity resonator 13. Each switch includes a solenoid 77 and a plunger 79. When activated the solenoid 77 causes the plunger 79 to close, shorting the node point 29 to the cavity case 99 which is a ground plane. In the case of the second cavity resonator 13 the solenoid 77 causes the plunger 79 to come in contact with the node point 39 thus shorting the node point 39 to the case 99 that is used to enclose the first cavity resonator 11 and the second cavity resonator 13.

Figure 4:
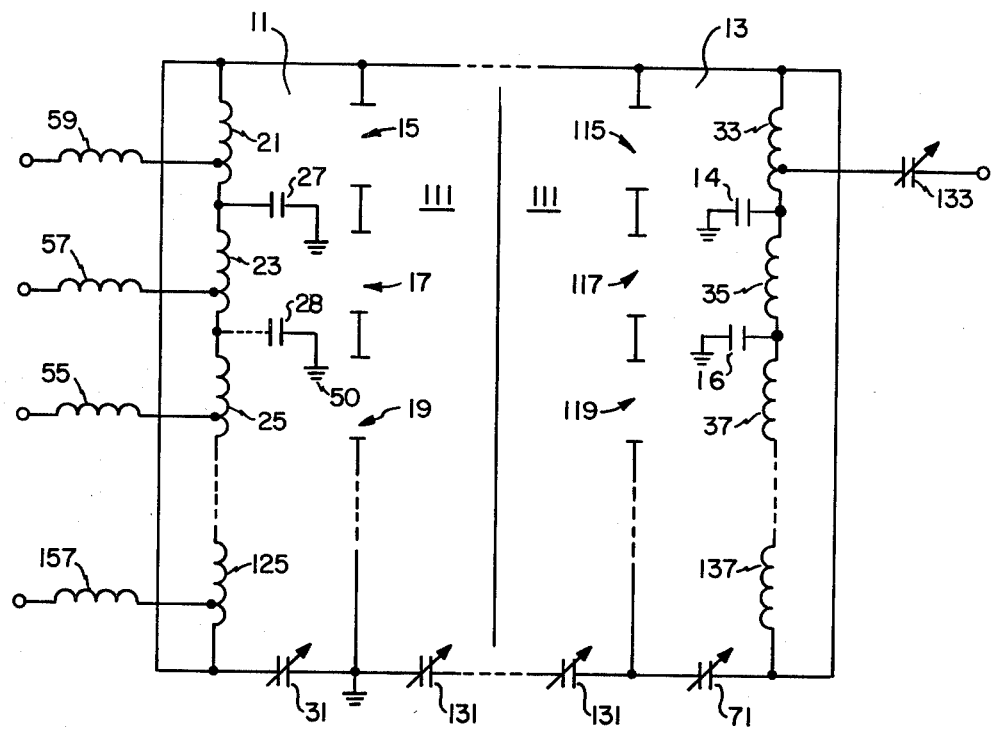
FIG. 4 is a partial sectional view of a further embodiment of a tunable bandpass filter according to the invention.

Although the embodiments of FIGS. 1 through 3 were disclosed to show a 3-band, 2-pole filter, it is possible to expand, using the techniques disclosed in FIG. 2, the selectable bandpass filter to contain N bands where N is any positive number and M poles where M is a positive number. This embodiment is shown in FIG. 4 where the first cavity resonator 11 includes a series connection of N inductors including inductors, 21, 23, 25 through the Nth inductor which is given the number 125. The output cavity resonator 13 also includes a series connection of N inductors including 33, 35, 37 through the Nth inductor 137. Between the input resonator and the output resonator are additional M cavity resonators 111 that have N aperture openings for magnetic coupling between each resonator. Each cavity resonator consists of a series connection of N coils which has a corresponding aperture opening for the magnetic coupling to the adjoining cavity resonator and a variable capacitor 131 for adjusting the resonant frequency of each cavity resonator to the bandpass frequency. Each internal cavity resonator includes an input of apertures 15, 17, 19, etc. and output apertures of 115, 117, 119, etc. which also corresponds to the input aperture of the neighboring resonator. The apertures that couple each cavity resonator to its neighbor are selected to achieve a desired filter characteristic. The 2-pole example is provided in Table 1 and in the theory of operation which can be extrapolated to the higher order filter.

In the preferred embodiment the selected bands required the shorting of the junctions 29 and 39 so that each resonator has approximately the same inductance.

THEORY OF OPERATIONS

The general operation of a 3-band, 2-pole filter may be appreciated from looking at the theory of operation of a 2-pole filter under minimum loss conditions. Equation 1 provides for calculating the loss (LS) of any equal element 2-pole minimum loss filter. This is solved mathematically from several matrix equations which are general knowledge in the art. Equal element means that each tank resonator is the same as all other resonators in the circuit. Equation 2 we say is a subscript or part of Equation 1 where "a" is an arbitrary variable as described by Equation 2. Equation 3 is also an arbitrary variable "b" used to simplify Equation 1. In Equation 4 "u" is a description of the percentage bandwidth of the filter. Percentage bandwidth means the actual loss value at a given percentage from the bandpass center frequency. "fo" is the frequency that the filter is tuned to and "f" is a frequency that is off from the tuned center frequency. "f" with no subscript is the actual frequency that is being measured or the response at a given frequency away from "fo". In Equation 5 "K" describes the coupling coefficient between the two resonator circuits. $Q_u$ in Equation 6 is a description of the physical characteristics of the cavity resonator. Q is a measure of the figure of merit. Equation 7, called $Q_t$ is the loaded Q of each tank that is loaded by the resistance that is reflected in from the input and output terminals. Equation 8, "K", is simply the coupling coefficient between each tank. $L_o$ in Equation 9 represents the insertion loss of the filter at the desired tuned frequency. Equation 9 and Equation 1 can be solved simultaneously knowing the required values or specified values of $L_o$ and $L_s$. Once these equations are solved, a value of K or coupling coefficient can be determined and using this value of coupling coefficient the apertures are mechanically or electronically sized for the required coupling between tanks.

Many changes and modifications in the above described invention can, of course, be carried out without departing from the scope thereof. Accordingly, the invention is intended to be limited only by the scope of the appended claims.

TABLE 1

(1) $L_s = 10 \text{ Log } \frac{1}{4} \left| \frac{(1+a)^2 + b^2}{-jb} \right|^2$ (2) $a = \frac{Q_t}{Q_u} + jQ_t u \left( \frac{u+2}{u+1} \right)$ (3) $b = (U + 1) K Q_t$ (4) $U = \frac{(f - fo)}{fo}$ (5) $K = \frac{1}{Q_t} \sqrt{1 + Q_t/Q_u}$ (6) $Q_u$ = Unloaded Q of each tank resonator
(7) $Q_t$ = Loaded Q of each tank resonator
(8) K = The coupling coefficient between each tank
(9) $L_o = \text{Log } \frac{1}{4} (1 + Q_t/Q_u)(2 + Q_t/Q_u)^2$

We claim:
1. A band selectable tunable bandpass filter comprising:

an electrically conductive cavity case having a first cavity and at least one second cavity spaced from and adjacent said first cavity within said cavity case, said cavities being coupled by a plurality of apertures therebetween and said case being coupled to a reference potential;

a first resonator means for resonating at a selectable frequency and including an electrical connection of at least three inductors and a tuning capacitor in series, said series connection having end terminals coupled to said reference potential and arranged within said first cavity such that each of said inductors is positioned adjacent a different one of said plurality of apertures within said first cavity;

at least one second resonator means for resonating at a selected frequency and including an electrical connection of at least three inductors and a tuning capacitor in series, said series connection having end terminals coupled to said reference potential and arranged within said at least one second cavity such that each of the inductors of said at least one second resonator means is positioned adjacent a different one of said plurality of apertures within said at least one second cavity, each of the inductors in said first and at least one second cavity which are adjacent the same aperture being electro-magnetically coupled solely through that aperture;

means for coupling an input signal to said series connection of said at least three inductors of said first resonator means;

means for coupling an output signal from the series connection of said at least three inductors of said at least one second resonator means; and means for selecting a passband of frequencies in said input signal passed by said first resonator means and said at least one second resonator means and including means for providing an electrical short between said reference potential and selected junctions formed by the interconnection of adjacent inductors in the series connection of inductors in said first and second resonator means.

2. The filter of claim 1 wherein said at least one second cavity is a plurality of second cavities forming a series of spaced cavities spaced such that each of said plurality of second cavities is separated from an adjacent cavity and is constructed to provide electromagnetic coupling between each adjacent cavity solely by a plurality of apertures therebetween, said at least one second resonator means comprising a plurality of second resonator means equal in number to said plurality of second cavities and wherein each of said second resonator means includes an electrical connection of at least three inductors and a tuning capacitor in series having end terminals coupled to said reference potential and arranged within a different one of said plurality of second cavities such that each of the inductors in a cavity is adjacent one of said plurality of apertures separating adjacent cavities and each of the inductors adjacent the same aperture in adjacent cavities are electromagnetically coupled solely through that aperture.

* * * * *